(12) United States Patent
Kim et al.

(10) Patent No.: US 10,756,143 B2
(45) Date of Patent: Aug. 25, 2020

(54) TRANSPARENT DISPLAY PANEL AND TRANSPARENT DISPLAY DEVICE INCLUDING THE SAME

(71) Applicant: LG DISPLAY CO., LTD., Seoul (KR)

(72) Inventors: EuiTae Kim, Paju-si (KR); MinKi Kim, Paju-si (KR); KiSeob Shin, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 628 days.

(21) Appl. No.: 15/239,538

(22) Filed: Aug. 17, 2016

(65) Prior Publication Data

US 2017/0053972 A1 Feb. 23, 2017

(30) Foreign Application Priority Data

Aug. 20, 2015 (KR) .................. 10-2015-0117310

(51) Int. Cl.
*H01L 27/32* (2006.01)
*H01L 51/52* (2006.01)

(52) U.S. Cl.
CPC ........ *H01L 27/3218* (2013.01); *H01L 27/326* (2013.01); *H01L 27/3216* (2013.01); *H01L 27/3246* (2013.01); *H01L 27/3276* (2013.01); *H01L 51/5284* (2013.01)

(58) Field of Classification Search
CPC ............. H01L 27/3218; H01L 27/3216; H01L 27/3246; H01L 27/326; H01L 27/3276; H01L 51/5284
See application file for complete search history.

(56) References Cited

U.S. PATENT DOCUMENTS

| | | | |
|---|---|---|---|
| 6,771,028 B1* | 8/2004 | Winters | G09G 3/3233 315/169.1 |
| 9,601,554 B2* | 3/2017 | Park | H01L 27/3267 |
| 2006/0170712 A1* | 8/2006 | Miller | H01L 27/3211 345/695 |
| 2009/0302331 A1* | 12/2009 | Smith | H01L 27/3216 257/88 |
| 2013/0112960 A1* | 5/2013 | Chaji | H01L 51/50 257/40 |
| 2013/0119413 A1 | 5/2013 | Harada et al. | |
| 2013/0134474 A1 | 5/2013 | Takeuchi et al. | |
| 2014/0027725 A1* | 1/2014 | Lim | H01L 51/5284 257/40 |
| 2014/0183472 A1 | 7/2014 | Kim et al. | |
| 2014/0183479 A1 | 7/2014 | Park et al. | |
| 2015/0137093 A1* | 5/2015 | Yang | H01L 27/3244 257/40 |

(Continued)

FOREIGN PATENT DOCUMENTS

| | | |
|---|---|---|
| CN | 104134683 A | 11/2014 |
| CN | 104425554 A | 3/2015 |

*Primary Examiner* — Peter Bradford
(74) *Attorney, Agent, or Firm* — Dentons US LLP

(57) ABSTRACT

A transparent display panel and a transparent display device including the same, including a plurality of data lines, a plurality of gate lines, and a plurality of pixel regions disposed in a matrix. The pixel region is configured by a plurality of sub pixels and includes transmission areas, circuit areas, and a plurality of emission areas which overlap with a part of the transmission areas and the circuit areas.

17 Claims, 16 Drawing Sheets

(56) References Cited

U.S. PATENT DOCUMENTS

2015/0187851 A1* 7/2015 Lee .................... H01L 27/3276
  257/40
2015/0279908 A1* 10/2015 Park ................... H01L 27/3276
  257/40
2015/0364712 A1* 12/2015 Lee .................... H01L 51/5209
  257/40

* cited by examiner

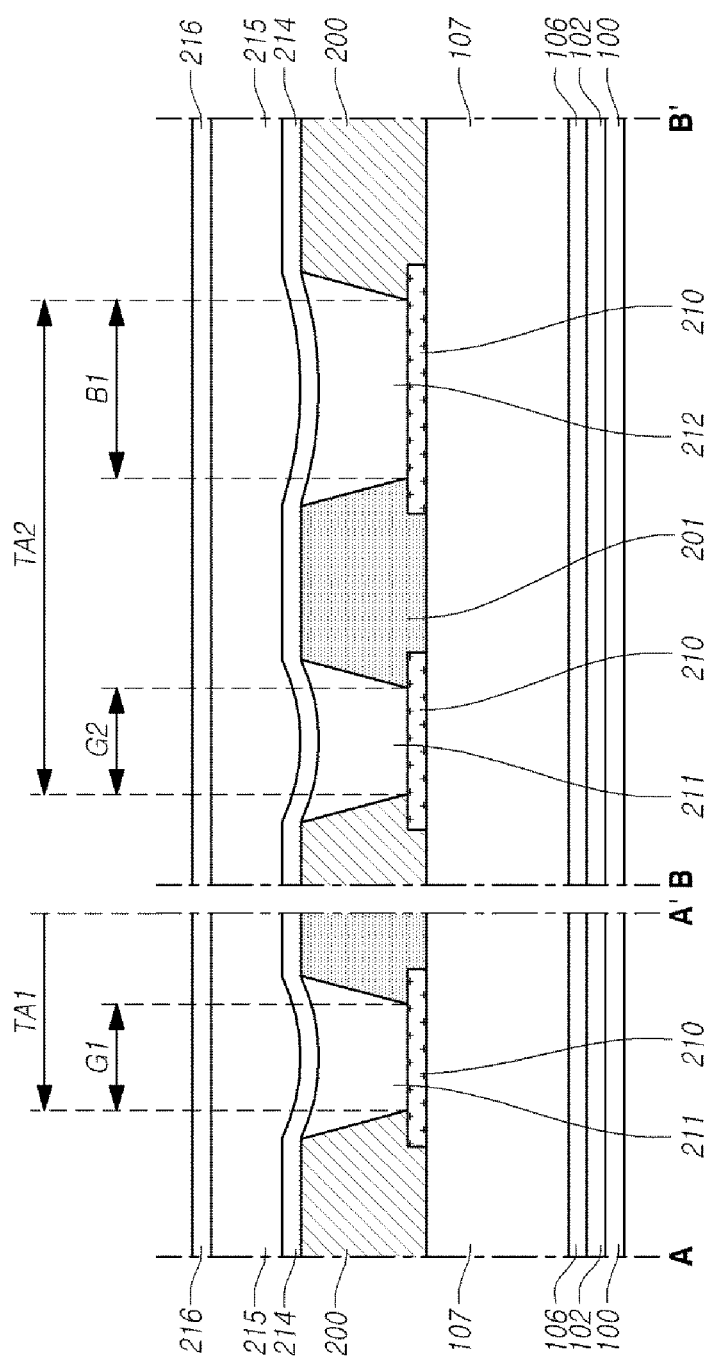

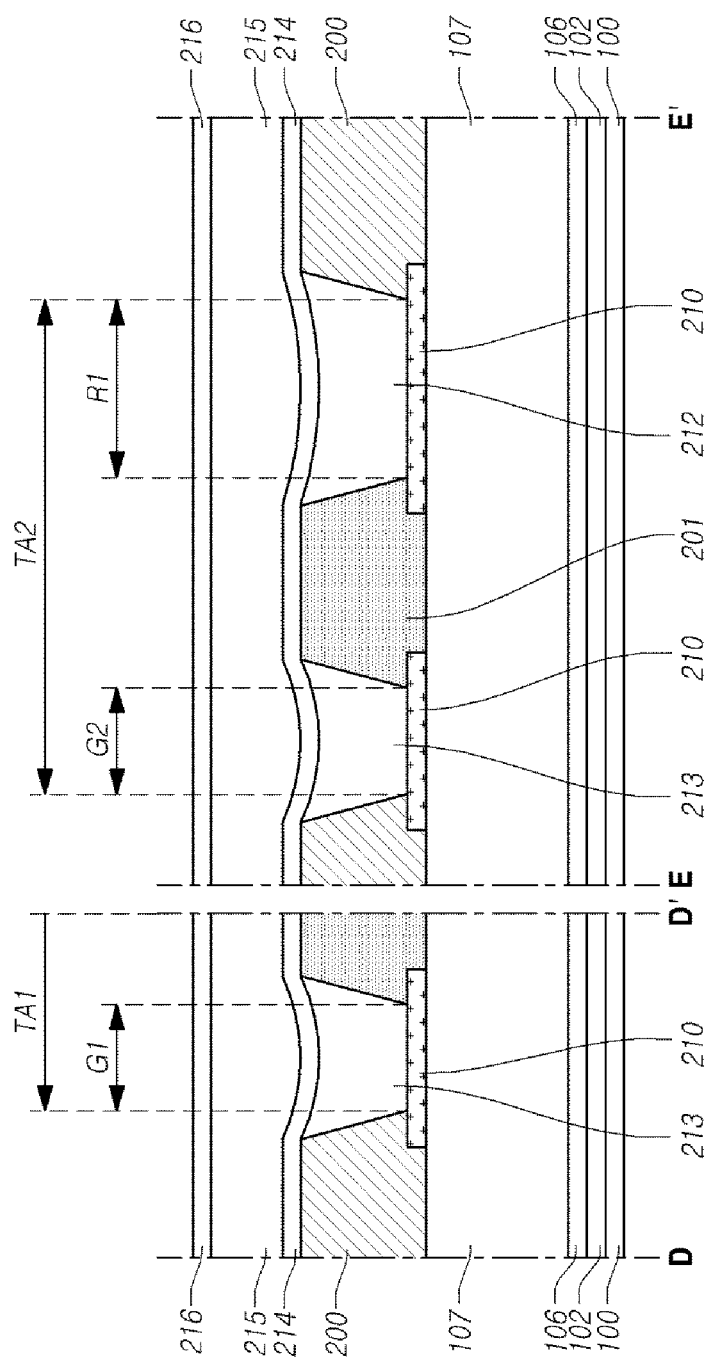

TRANSPARENT DISPLAY PANEL AND TRANSPARENT DISPLAY DEVICE INCLUDING THE SAME

CROSS-REFERENCE TO RELATED APPLICATIONS

This application claims priority from Korean Patent Application No. 10-2015-0117310 filed on Aug. 20, 2015, which is hereby incorporated by reference for all purposes as if fully set forth herein.

BACKGROUND

Field

The present invention relates to a transparent display panel and a transparent display device including the same.

Description of the Related Art

As our information-oriented society progresses, demands for various types of display devices for displaying images are increasing. In the past, display devices such as a liquid crystal display device, a plasma display device, and an organic light emitting display device have been used.

As display devices continue to actively develop, designs that are different and diverse from existing ones are being demanded. For example, display devices which may enhance an aesthetic function and have multi-function for usage, such a transparent display device, have been considered.

As a method for increasing the transparency of a transparent display device, a change in the panel design may be considered. However, an emission size may be narrowed due to the changed panel design, resulting in lowered emission efficiency. As another method for increasing the transparency of a transparent display device, an increase in an emission size to improve the emission efficiency may be considered. In this case, however, the transparency may be lowered and the transparent display device may not function satisfactorily.

When a reflector is used for the transparent display device, a color filter substrate including a color filter layer is required to suppress the reflection of the reflector. Further, a process of bonding the color filter substrate to a substrate including a plurality of elements is required. In this case, high precision is required for the process of bonding the substrate including a plurality of elements and the color filter substrate, and the process can thus be complicated.

Therefore, a transparent display device with improved emission efficiency and transparency, and which is manufactured through a simple process, is desirable.

SUMMARY

An aspect of the present invention includes a transparent display panel which improves both the transparency and the emission efficiency of a transparent display device and a transparent display device including the same.

The transparent display panel includes a plurality of data lines, a plurality of gate lines, and a plurality of pixel regions disposed in a matrix. The pixel regions are configured by a plurality of transmission areas and circuit areas and include a plurality of emission areas which share a part of the transmission areas and a part of the circuit areas.

In this case, two pixel regions of the transparent display device may be configured by four sub pixel regions. The two pixel regions may together include a first transmission area, a second transmission area, and circuit areas, and each of the first transmission area, the second transmission area, and the circuit areas may include at least one emission area.

At least one emission area may partially or entirely share a region where the circuit areas are disposed. In this case, organic light emitting diodes disposed in the circuit areas and an emission area which shares the circuit areas may include a reflective layer. The emission areas disposed in the first and second transmission areas may be divided by a transparent bank pattern.

In another embodiment, two pixel regions of the transparent display device may be configured by five sub pixel regions, and may include a first transmission area, a second transmission area, and circuit areas. Each of the first transmission area, the second transmission area, and the circuit areas may include at least one emission area.

Further, at least one emission area may partially or entirely share the circuit areas. In this case, an organic light emitting diode disposed in the circuit areas and an emission area which shares the circuit area may include a reflective layer. The emission areas disposed in the first and second transmission areas may be divided by a transparent bank pattern.

In the transparent display panel according to an aspect of the present invention and the transparent display device including the same, a part of an emission area shares a part of a region where a transmission area is disposed, so that the transmission area may be increased regardless of an emission size of the emission area.

Further, in the transparent display panel according to an aspect of the present invention and the transparent display device including the same, an element to be disposed in the emission area is disposed in the transmission area or an opaque area in consideration of a characteristic of the element. Therefore, the emission efficiency of an organic light emitting diode can be appropriately adjusted.

Further, in the transparent display panel according to an aspect of the present invention and the transparent display device including the same, a color filter layer may be omitted. Therefore, a configuration of the transparent display device may be simplified and a gap between a first substrate and a second substrate may be reduced.

Furthermore, in the transparent display panel according to an aspect of the present invention and the transparent display device including the same, a bonding process of a color filter substrate including a color filter may be omitted, and the process may thus be further simplified

BRIEF DESCRIPTION OF THE DRAWINGS

The above and other aspects, features and other advantages of the present invention will be more clearly understood from the following detailed description taken in conjunction with the accompanying drawings, in which:

FIG. 4A is a cross-sectional view of a transparent display device according to a first exemplary embodiment of the present invention taken along the lines A-A' and B-B';

FIG. 7A is a cross-sectional view of a transparent display device according to a second exemplary embodiment of the present invention taken along the lines D-D' and E-E';

DETAILED DESCRIPTION OF THE EMBODIMENTS

Figure 1:
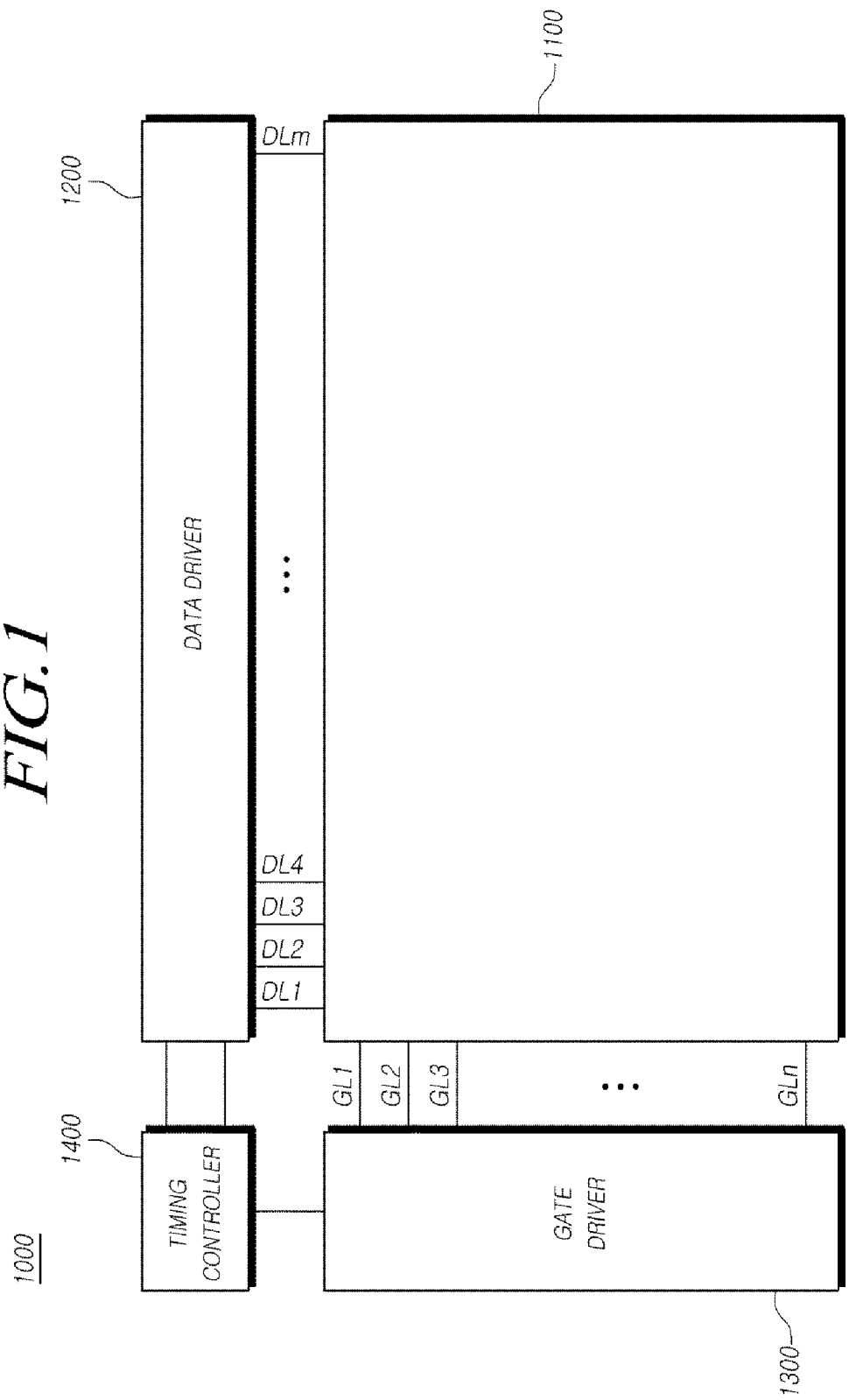
FIG. 1 is a schematic system configuration view of a transparent display device 1000 according to the present exemplary embodiments.

Hereinafter, exemplary embodiments of the present invention will be described in detail with reference of the accompanying drawings. The following exemplary embodiments are provided for sufficiently conveying the concept of the present invention to those skilled in the art. Therefore, the present invention is not limited to the following exemplary embodiments themselves but can be modified and changed in other embodiments. In the drawings, a size and a thickness of the device may be exaggerated for the sake of convenience. Like reference numerals principally refer to like elements throughout the specification.

Advantages and characteristics of the present invention and a method of achieving the advantages and characteristics will be clear by referring to exemplary embodiments described below in detail together with the accompanying drawings. However, the present invention is not limited to the following exemplary embodiments but may be implemented in various different forms. The exemplary embodiments are provided only to complete disclosure of the present invention and to fully provide a person having ordinary skill in the art to which the present invention pertains with the category of the disclosure, and the present invention will be defined by the appended claims. Like reference numerals indicate like elements throughout the specification. In the drawings, a size and a relative size of a layer or an area may be exaggerated for clarity of description.

When an element or layer is disposed "on" other element or layer, another layer or another element may be interposed directly on the other element or therebetween. In contrast, when an element is referred to as being "immediately on" or "directly on", no intervening elements or layers may be present.

The terms, such as "below, beneath", "lower", "above", or "upper" are spatially relative terms and may be used to describe relationship between one element or component and another element or components, as illustrated in the drawings. The spatially relative term should be understood to include different directions of the element which is used or operates, in addition to the direction illustrated in the drawing. For example, when the element which is illustrated in the drawing is turned over, an element which is disposed below or beneath another element may be disposed above the other element. Therefore, an exemplary term "below" may include "below" and "above".

Further, in describing components of the present invention, terminologies such as first, second, A, B, (a), (b), and the like may be used. The term is used to distinguish a component from the other component but a nature, an order, or the number of the components is not limited by the terminology.

FIG. 1 is a schematic system configuration view of a transparent display device 1000 according to the present exemplary embodiments. Referring to FIG. 1, a transparent display device 1000 according to the present exemplary embodiments includes a transparent display panel 1100 in which a plurality of data lines DL to DLm, a plurality of gate lines GL1 to GLn, and a plurality of pixel regions are disposed, a data driver 1200 which drives the plurality of data lines DL to DLm, a gate driver 1300 which drives the plurality of gate lines GL1 to GLn, and a timing controller 1400 which controls the data driver 1200 and the gate driver 1300.

The data driver 1200 drives the plurality of data lines by supplying a data voltage to the plurality of data lines. Further, the gate driver 1300 sequentially drives the plurality of gate lines by sequentially supplying scan signals to the plurality of gate lines.

Furthermore, the timing controller 1400 controls the data driver 1200 and the gate driver 1300 by supplying control signals to the data driver 1200 and the gate driver 1300. The timing controller 1400 starts scanning according to a timing implemented in each frame, and converts input image data to be suitable for a data signal form used by the data driver 1200 to output the converted image data. The timing controller 1400 controls data driving at a proper time corresponding to the scanning.

The gate driver 1300 sequentially drives the plurality of gate lines by sequentially supplying an ON voltage or an OFF voltage scan signal to the plurality of gate lines according to the control of the timing controller 1400. Further, the gate driver 1300 may be located at only one side of the transparent display panel 1100 as illustrated in FIG. 1 or may be located at both sides thereof if necessary, according to a driving method or a design method of the transparent display panel.

Further, the gate driver 1300 may include one or more gate driver integrated circuits. Each of the gate driver integrated circuits may be connected to a bonding pad of the transparent display panel 1100 through a tape automated bonding (TAB) method or a chip on glass (COG) method. Each of the gate driver integrated circuits may also be implemented in a Gate In Panel (GIP) type to be directly disposed in the transparent display panel 1100, or may be integrated and disposed in the transparent display panel 1100 if necessary.

Further, each of the gate driver integrated circuits may be implemented in a chip on film (COF) type. In this case, a gate driving chip corresponding to each gate driver integrated circuit may be mounted on a flexible film, and one end of the flexible film may be bonded to the transparent display panel 1100.

If a specific gate line is opened, the data driver 1200 converts image data received from the timing controller 1400 into a data voltage of an analog form and supplies the data voltage to the plurality of data lines to drive the plurality of data lines. Further, the data driver 1200 may include at least one source driver integrated circuit to drive the plurality of data lines.

Each of the source driver integrated circuits may be connected to a bonding pad of the transparent display panel 1100 through a tape automated bonding (TAB) method or a chip on glass (COG) method. Each of the source driver integrated circuits may also be directly disposed in the transparent display panel 1100, or may be integrated and disposed in the transparent display panel 1100 if necessary.

Each of the source driver integrated circuits may be implemented in a chip on film (COF) type. In this case, a source driving chip corresponding to each source driver integrated circuit is mounted on a flexible film. One end of the flexible film is bonded to at least one source printed circuit board and the other end thereof is bonded to the transparent display panel 1100.

The source printed circuit board is connected to a control printed circuit board through a connecting medium such as a flexible flat cable (FFC) or a flexible printed circuit (FPC). The timing controller 1400 is disposed in the control printed circuit board.

Further, in the control printed circuit board, a power controller (not illustrated) configured to supply a voltage or current to the transparent display panel 1100, the data driver 1200, the gate driver 1300, and the like, or to control a voltage or current to be supplied may be further disposed. The above-mentioned source printed circuit board and control printed circuit board may be formed as one printed circuit board.

In the meantime, in the transparent display device according to the exemplary embodiments of the present invention, a plurality of pixels may be configured with a RGB structure. Further, a plurality of pixels may be arranged so that two pixels are configured by four sub pixels (hereinafter, referred to as a "2P-4SP structure"). The structure may be applied to all the exemplary embodiments of the present invention which will be described below. However, the exemplary embodiments of the present invention are not limited to the above-described structure and any number of pixels may be configured by any number of sub pixels.

As described above, in the transparent display device according to the exemplary embodiments of the present invention, a plurality of pixels may be configured with a plurality of sub pixels, such as in the 2P-4SP structure. Therefore, the same resolution as that of a RGB structure may be achieved with a reduced number of sub pixels. Further, by reducing the number of sub pixels, the transparency of the transparent display device may be improved.

The 2P-4SP structure which is applied to the transparent display device according to the exemplary embodiments of the present invention may include a RG-BG structure or a RG-BW structure, but the exemplary embodiments of the present invention are not limited thereto. However, for the convenience of description, in the following exemplary embodiments, a RG-BG structure in which three color sub-pixels are used will be mainly described.

Figure 2:
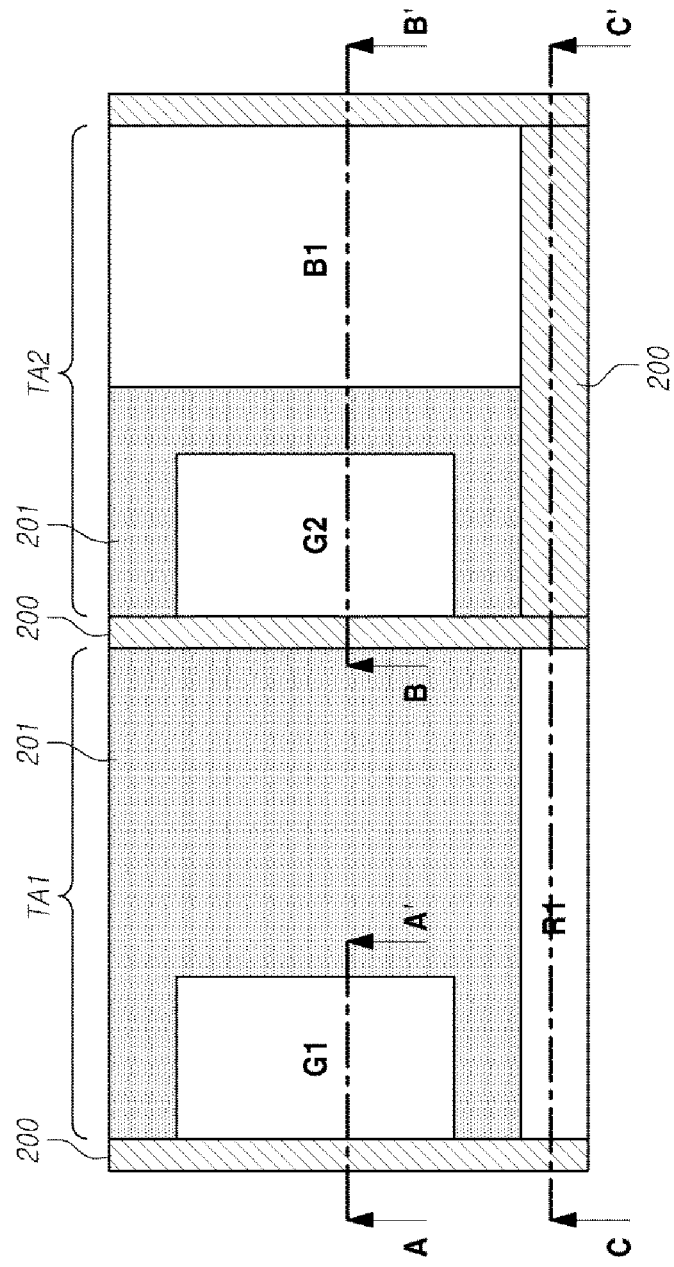
FIG. 2 is a plan view of a transparent display device according to a first exemplary embodiment of the present invention.
Figure 3:
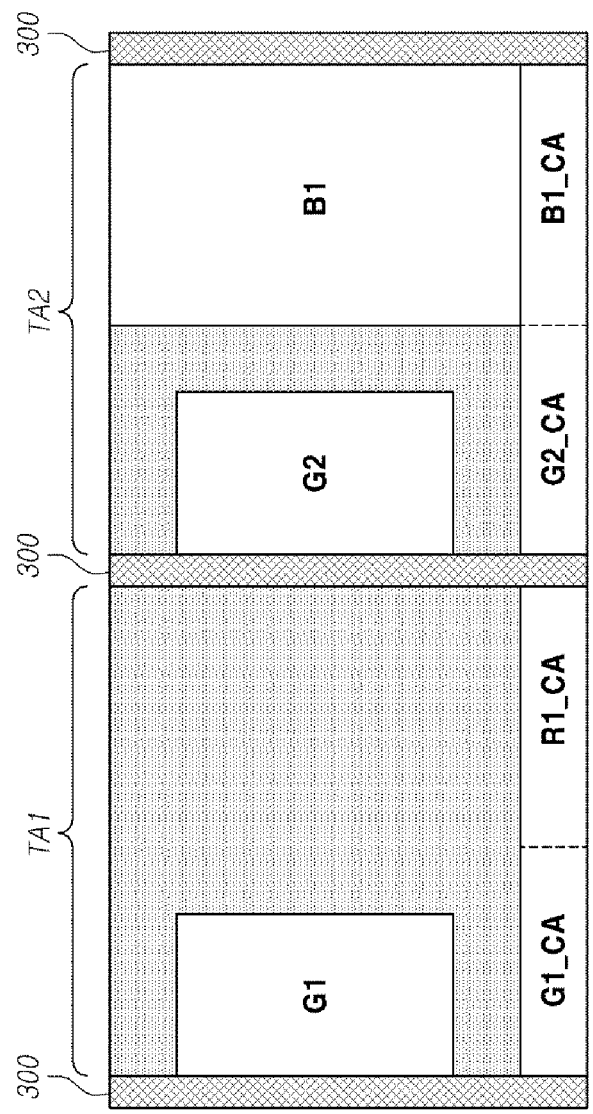
FIG. 3 is a schematic plan view of a circuit area of a transparent display device according to a first exemplary embodiment of the present invention.
Figure 4B:
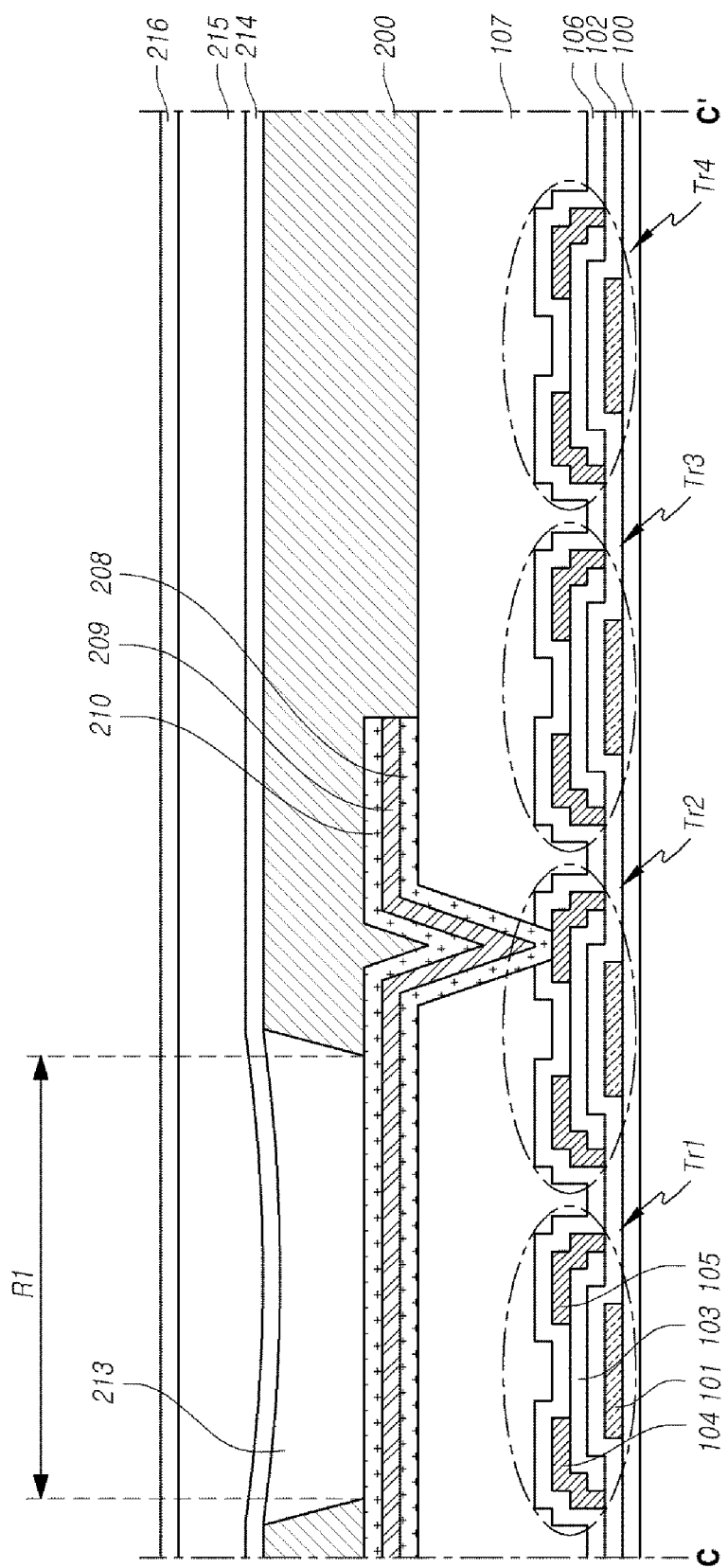
FIG. 4B is a cross-sectional view of a transparent display device according to a first exemplary embodiment of the present invention taken along the line C-C'.

Next, a transparent display device according to a first exemplary embodiment of the present invention will be described with reference to FIGS. 2 to 4B, as follows. FIG. 2 is a plan view of a transparent display device according to a first exemplary embodiment of the present invention. FIG. 3 is a schematic plan view of a circuit area of a transparent display device according to a first exemplary embodiment of the present invention. FIG. 4A is a cross-sectional view of a transparent display device according to a first exemplary embodiment of the present invention taken along the lines A-A' and B-B'. FIG. 4B is a cross-sectional view of a transparent display device according to a first exemplary embodiment of the present invention taken along the line C-C'.

Referring to FIGS. 2 and 3, the transparent display device according to the first exemplary embodiment of the present invention has a RG-BG structure. In this structure, four sub pixel regions may configure two pixel regions. Further, a column line 300 including two data lines among the plurality of data lines and at least one voltage line may be disposed at every pixel region.

As described above, the column line is disposed at every pixel region, each of which includes two sub pixel regions, and thus the column line region may be reduced compared to a configuration in which a column line is disposed at every sub pixel region. As a result, an opaque area of the display device may be reduced.

In this case, a first bank pattern 200 may be disposed on the column line 300. Here, the first bank pattern 200 may be formed of an opaque organic material. For example, the first bank pattern 200 may be a black bank pattern, allowing light reflected due to the column lines 300 to be blocked.

Each of the four sub pixel regions may include one emission area and one circuit area. Further, the two pixel regions may include a first transmission area TA1 and a second transmission area TA2.

Further, each of the two pixel regions may include two circuit areas. Specifically, the two pixel regions may together include a first circuit area G1_CA, a second circuit area R1_CA, a third circuit area G2_CA, and a fourth circuit area B1_CA.

Although not illustrated in the drawings, the data lines included in the column line 300 may be connected to the first to fourth circuit areas G1_CA, R1_CA, G2_CA, and B1_CA, respectively. Further, the voltage line of the column line 300 may be a high potential voltage line or a low potential voltage line. In the exemplary embodiment of the present invention, the column line 300 may include alternating high potential voltage lines and low potential voltage lines. Four wiring lines branched from the voltage line of the column line 300 may be connected to the first to fourth circuit areas G1_CA, R1_CA, G2_CA, and B1_CA.

The first transmission area TA1, the second transmission area TA2, and the circuit areas G1_CA, R1_CA, G2_CA, and B1_CA may include at least one or more emission areas. Specifically, the first transmission area TA1 may include a first emission area G1. Further, the second transmission area TA2 may include a second emission area G2 and a third emission area B1.

Further, the circuit areas may include a fourth emission area R1 which overlaps with a part of a region where the circuit areas are disposed. For example, the fourth emission area R1 may overlap with the first circuit area G1_CA and the second circuit area R1_CA. However, the present invention is not limited thereto. For example, the fourth emission area R1 may also extend in part or fully to the third circuit area G2_CA or to the fourth circuit area B1_CA.

Here, the first emission area G1 and the second emission area G2 may emit light with a first color, the third emission area B1 may emit light with a second color, and the fourth emission area R1 may emit light with a third color. For example, the first color may be green G, the second color may be blue B, and the third color may be red R. Although this structure may employ a reduced number of sub pixels as compared to the RGB structure, a transparent display device employing this structure may achieve the same resolution as that of a display device using the RGB structure.

Further, in the transparent display device according to the first exemplary embodiment of the present invention, emission areas which emit light with different colors may have varying emission sizes.

For example, the first emission area G1 and the second emission area G2 may have a same emission size. Further, a sum of the emission size of the first emission area G1 and the emission size of the second emission area G2 may be smaller than an emission size of the third emission area B1. Further, an emission size of the fourth emission area R1 may be smaller than the sum of the emission size of the first emission area G1 and the emission size of the second emission area G2. That is, the third emission area B1 may have the largest emission size.

Through such a configuration, the third emission area B1 may have a large emission size despite an organic light emitting diode disposed in the third emission area B1 having a short life-span and a low emission efficiency. As such, the life-span and the emission efficiency of the transparent display device may be improved.

However, a configuration of emission sizes of the emission areas of the transparent display device according to the first exemplary embodiment of the present invention is not limited thereto. For example, the sum of the emission size of the first emission area G1 and the emission size of the second emission area G2 may be equal to the emission sizes of the third emission area B1 and the fourth emission area R1. As such, for example, light quantities generated through emission areas for each color may be configured to be constant.

In FIG. 2, in regions of the first transmission area TA1 and the second transmission area TA2 where emission areas G1, G2, and B1 are not disposed, a second bank pattern 201 may be disposed. Here, the second bank pattern 201 may be formed of a transparent organic material. For example, the second bank pattern may be a transparent bank pattern. That is, the second bank pattern 201 disposed in the transparent areas TA1 and TA2 may be formed of a transparent material, so allow an expanded transmission area.

As illustrated in FIG. 3, two circuit areas may be disposed in one pixel region. Specifically, the first circuit area G1_CA and the second circuit area R1_CA may be disposed below the first transparent area TA1. Further, the third circuit area G2_CA and the fourth circuit area B1_CA may be disposed below the second transparent area TA2.

Here, the first circuit area G1_CA may drive an organic light emitting diode disposed in the first transmission area TA1, such as the first emission area G1. The second circuit area R1_CA may drive the fourth emission area R1 which overlaps with a part of the region where the circuit areas are disposed. The third circuit area G2_CA may drive the third emission area G2 disposed in the second transmission area TA2 and the fourth circuit area B1_CA may drive the fourth emission area B1 disposed in the second transmission area TA2.

The above-described configuration will be described in detail with reference to the cross-sectional views of the transparent display device according to the first exemplary embodiment of the present invention, along the lines A-A', B-B', and C-C'. FIG. 4A illustrates an arrangement and configuration of the plurality of column lines and the transmission areas. The transparent display device according to the first exemplary embodiment of the present invention includes a first insulating layer 102, a second insulating layer 106, and a third insulating layer 107 disposed on the substrate 100. In this case, the first substrate 100 and the first to third insulating layers 102, 106, and 107 may all be formed of transparent materials.

Although FIG. 4A illustrates a configuration with a plurality of insulating layers, the transparent display device according to the exemplary embodiment of the present invention is not limited thereto. For example, the insulating layer may include a single layer or omitted altogether.

The first transmission area TA1 and the second transmission area TA2 may be disposed on the first substrate 100. The first transparent area TA1 may include the first emission area G1 and the second transmission area TA2 may include the second emission area G2 and the third emission area B1.

The first to third emission areas G1, G2, and B1 may be configured by a first electrode 210, organic light emitting layers 211 and 212, and a second electrode 214 of organic light emitting diodes. Specifically, the first electrode 210 of each organic light emitting diode may be disposed on the third insulating layer 107. The first electrode 210 may be an anode of each organic light emitting diode.

Further, the first electrode 210 may be formed of a transparent conductive material. For example, the first electrode 210 may be formed of any one of indium tin oxide (ITO), indium zinc oxide (IZO), and indium tin zinc oxide (ITZO). However, the material of the first electrode 210 is not limited thereto, and the first electrode 210 may be formed any kind of transparent conductive material.

On parts of a top surface of the first electrode 210, bank patterns 200 and 201 which define the emission area may be disposed. Specifically, the first bank pattern 200 may be disposed at one end of the first electrode 210 and the second bank pattern 201 may be disposed at the other end of the first electrode 210.

Here, a region where the first electrode 201 overlaps the first bank pattern 200 may be adjacent to a region where the column lines are disposed. A region that overlaps the second bank 201 may be a region that is included in the first transparent area TA1 or the second transparent area TA2.

The organic light emitting layer 211 or 212 of the organic light emitting diodes may be disposed on a portion of the top surface of each first electrode 210 that is exposed by the first and second bank patterns 200 and 201. Here, the organic light emitting layer 211 disposed in the first transmission area TA1 may emit light with the first color. Further, the organic light emitting layers 211 and 212 disposed in the second transmission area TA2 may emit light with the first color and the second color, respectively.

The organic light emitting layers 211 and 212 may be formed of a transparent organic material. The second electrode 214 of the organic light emitting diode may be disposed on the organic light emitting layers 211 and 212. The second electrode 214 may be a cathode of the organic light emitting diode.

The second electrode 214 may be formed of a transparent conductive material. For example, the second electrode 214 may be formed of any one of indium tin oxide (ITO), indium zinc oxide (IZO), and indium tin zinc oxide (ITZO). However, the material of the second electrode 214 is not limited thereto and may be formed any kind of transparent conductive material.

A sealing layer 215 and a second substrate 216 are disposed on the second electrode 214. Here, the sealing layer 215 and the second substrate 216 may be formed of a transparent material.

As described above, all components disposed in the first transmission area TA1 and the second transmission area TA2 may be formed of transparent materials. Specifically, the first transmission area TA1 and the second transmission area TA2 may include at least one emission area and components disposed in the emission area may be formed of transparent materials. Therefore, a size of the transmission area of the display device may be increased without being affected by the emission areas of the display device. Further, the emission areas may be configured without being affected by the size of the transmission area.

FIG. 4B illustrates an arrangement and configuration of a plurality of circuit areas. The transparent display device according to the first exemplary embodiment may include a plurality of thin film transistors Tr1, Tr2, Tr3, and Tr4 disposed on a substrate 100.

Each of the plurality of thin film transistors Tr1, Tr2, Tr3, and Tr4 may include a gate electrode 101, an active layer 103, a source electrode 104, and a drain electrode 105 disposed on the first substrate 100. Further, a first insulating layer 102 is disposed on the gate electrode 101 and a second insulating layer 106 and a third insulating layer 107 may be disposed on the source electrode 104 and the drain electrode 106.

Here, a first thin film transistor Tr1 may the first emission area G1, a second thin film transistor Tr2 may drive the fourth emission area R1, a third thin film transistor Tr3 may drive the second emission area G2, and a fourth thin film transistor Tr4 may drive the third emission area B1.

That is, the first thin film transistor Tr1 is disposed in the first circuit area G1_CA, the second thin film transistor Tr2 is disposed in the second circuit area R1_CA, the third thin film transistor Tr3 is disposed in the third circuit area G2_CA, and the fourth thin film transistor Tr4 is disposed in the fourth circuit area B1_CA.

Although one transistor is disposed in each of the circuit areas in FIG. 4B, the transparent display device according to the exemplary embodiment of the present invention is not limited thereto. For example, one or two thin film transistors and one or two capacitors may be further provided in each of the circuit areas.

The drain electrode 105 of the second thin film transistor Tr2 which drives the fourth emission area R1 is electrically connected to the first electrode 210 of the organic light emitting diode which emits light with the third color. Here, a reflective layer 209 may be disposed below the first electrode 210. A transparent conductive layer 208 may be further disposed below the reflective layer 209 to smoothly transport a hole to an organic light emitting layer 213.

On a part of a top surface of the first electrode 210, the first bank pattern 200 may be disposed. Both ends of the first electrode 210 of the organic light emitting diode which emits the light with the third color may overlap the first bank pattern 200 which is formed of an opaque organic material, so that light leakage may be suppressed. Further, light reflected by metal wiring lines and metal electrodes disposed in a region excluding a region where the fourth emission area R1 is disposed may be blocked.

The organic light emitting layer 213 which emits light with the third color may be disposed on a portion of the top surface of the first electrode 210 exposed by the first bank pattern 200. The second electrode 214, a sealing layer 215, and a second substrate 216 may be respectively disposed on the organic light emitting layer 213.

Here, the reflective layer 209 may be disposed below the first electrode 210, and as a result the emission efficiency of the organic light emitting diode which emits light with the third color may be improved. Specifically, light generated from the organic light emitting diode may be reflected by the reflective layer 209 so that light is emitted only toward the second substrate 216. That is, light that is emitted downwardly toward the reflective layer 209 may be emitted back upward toward the second substrate 216. As such, the emission efficiency of the organic light emitting diode may be improved.

Although only an organic light emitting diode which emits the light with the third color is illustrated with the above-described structure in the drawings, first electrodes 210 connected to the drain electrodes 105 of the first thin film transistor Tr1, the second thin film transistor Tr2, third thin film transistor Tr3, and the fourth thin film transistor Tr4 may also be configured in similar structures.

Although not illustrated in the drawings, the first electrodes 210 connected to the drain electrodes 105 of the first thin film transistor Tr1 and the second thin film transistor Tr2 may partially overlap. Further, the first electrodes 210 connected to the drain electrodes 105 of the third thin film transistor Tr3 and the fourth thin film transistor Tr4 may partially overlap.

Further, in the transparent display device according to the exemplary embodiment of the present invention, the portion of the first electrode 210 disposed in the transmission area, and the portion of the first electrode 210 and the reflective layer 209 disposed in the circuit area may be formed using one mask. In this case, the mask may be a halftone mask.

Specifically, a material for the transparent conductive layer 208, a material for the reflective layer 209, a material for the first electrode 210, and a photoresist are formed on the first substrate 100. A transmissive unit of the halftone mask corresponds to a region of the circuit area where the first electrode 210, the reflective layer 209, and the transparent conductive layer 208 are disposed. A transflective unit of the halftone mask corresponds to a region of the transmission area where the second electrode 214 is disposed. A blocking unit corresponds to the remaining area.

Thereafter, a photoresist pattern, the first electrode material, and the reflective layer material which are disposed in a region of the circuit area excluding the region where the first electrode 210 and the reflective layer 209 are disposed are etched.

Thereafter, a material for the first electrode 210 and the photoresist are further formed on the first substrate 100. The transmissive unit of the halftone mask corresponds to a region of the circuit area where the first electrode 210, the reflective layer 209, and the transparent conductive layer 208 are disposed. The transflective unit corresponds to a region of the transmission area where the second electrode 214 is disposed. The blocking unit corresponds to the remaining area.

Thereafter, when the material for the first electrode 210 disposed in the blocking unit is etched and the photoresist pattern on the first electrode 210 disposed in the circuit area and the photoresist pattern on the first electrode 210 disposed in the transmission area are removed, the first electrode 210, the reflective layer 209, and the transparent conductive layer 208 are formed in the circuit area. Further, only the first electrode 210 is formed in the transmission area.

A manufacturing method of a transparent display device according to an exemplary embodiment of the present invention is not limited thereto. The transparent display device may be manufactured using a mask which simultaneously forms a bank pattern which will be formed later. The manufacturing method of a transparent display device according to the exemplary embodiment of the present invention may be simplified through the above-described manufacturing method.

Figure 5:
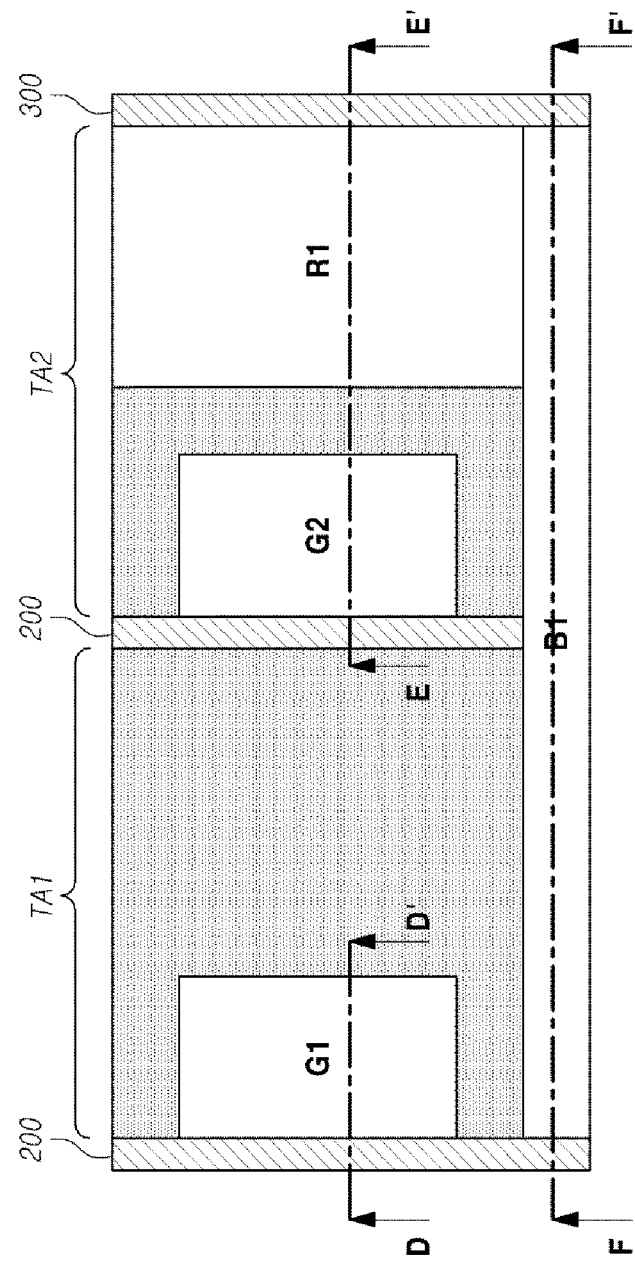
FIG. 5 is a plan view of a transparent display device according to a second exemplary embodiment of the present invention.
Figure 6:
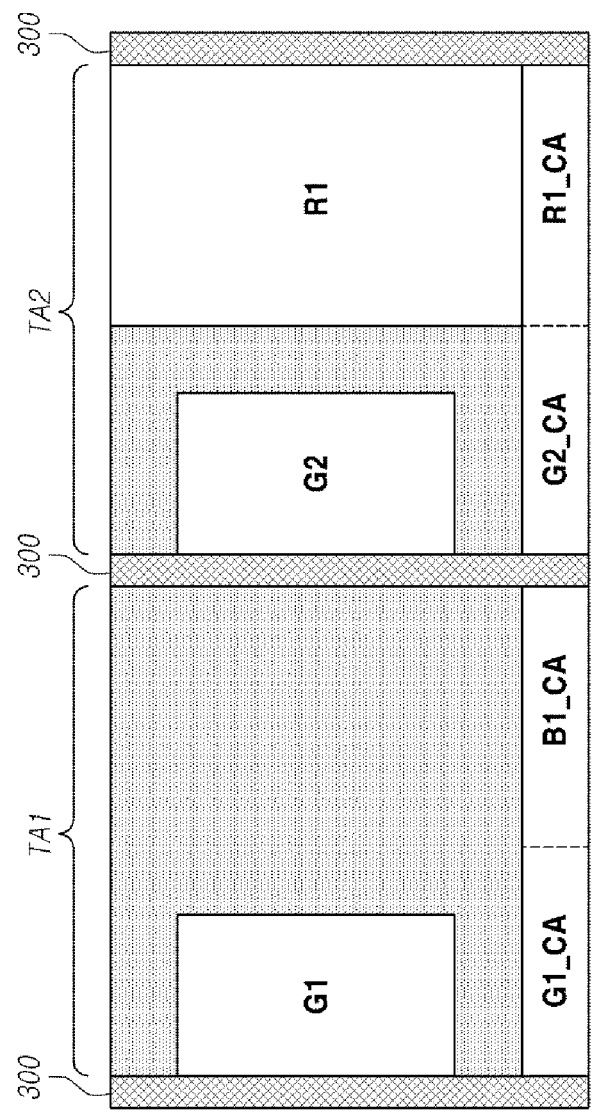
FIG. 6 is a schematic plan view of a circuit area of a transparent display device according to a second exemplary embodiment of the present invention.
Figure 7B:
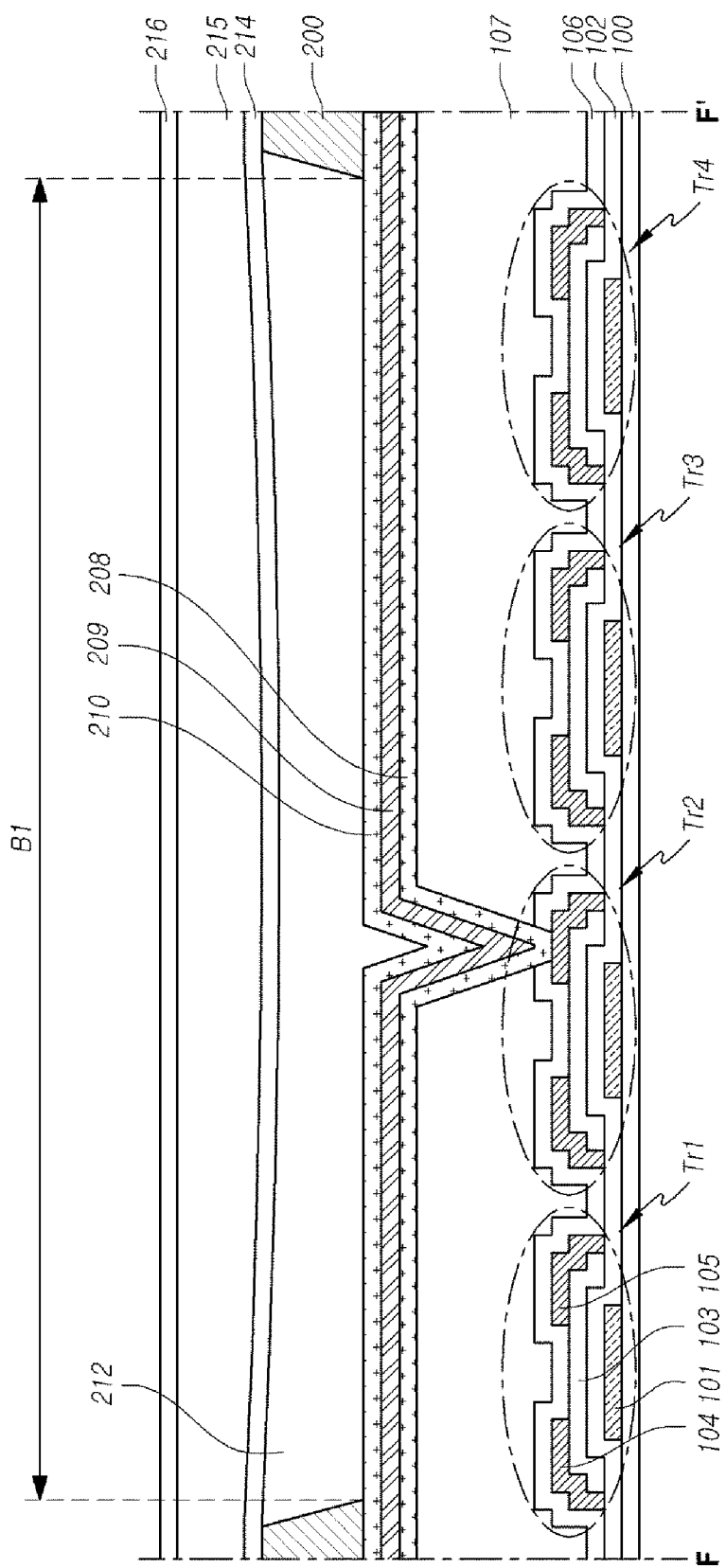
FIG. 7B is a cross-sectional view of a transparent display device according to a second exemplary embodiment of the present invention taken along the line F-F'.

Next, a transparent display device according to a second exemplary embodiment of the present invention will be described with reference to FIGS. 5 to 7B, as follows. FIG. 5 is a plan view of a transparent display device according to a second exemplary embodiment of the present invention. FIG. 6 is a schematic plan view of a circuit area of a transparent display device according to a second exemplary embodiment of the present invention. FIG. 7A is a cross-sectional view of a transparent display device according to a second exemplary embodiment of the present invention taken along the lines D-D' and E-E'. FIG. 7B is a cross-sectional view of a transparent display device according to a second exemplary embodiment of the present invention taken along the line F-F'.

The transparent display device according to the second exemplary embodiment may include the same components as those of the above-described exemplary embodiment of the present invention. Redundant descriptions thereof will be omitted. Further, like reference numerals generally refer to like components.

Referring to FIGS. 5, 6, 7A, and 7B, the transparent display device according to the second exemplary embodiment of the present invention is different from the transparent display device according to the first exemplary embodiment of the present invention in that the third emission area which emits light with the second color emits light with the third color instead, and the fourth emission area which emits light with the third color emits light with the second color instead.

In the transparent display device according to the second exemplary embodiment of the present invention, the first circuit area G1_CA which is required to drive the first emission area G1 and the second circuit area B1_CA which is required to drive the fourth emission area B1 are disposed below the first transmission area TA1. Further, the third circuit area G2_CA which is required to drive the second emission area G2 and the fourth circuit area R1_CA which is required to drive the third emission area R1 are disposed below the second transmission area TA2.

Further, as illustrated in FIG. 7B, the first thin film transistor Tr1 drives the organic light emitting diode disposed in the first emission area G1 and the second thin film transistor Tr2 drives the organic light emitting diode disposed in the fourth emission area B1. Further, the third thin film transistor Tr3 drives the organic light emitting diode disposed in the second emission area G2 and the fourth thin film transistor Tr4 drives the organic light emitting diode disposed in the third emission area R1.

Further, in FIGS. 5 and 7B, the fourth emission area B1 of the transparent display device according to the second exemplary embodiment of the present invention may share the entire area where the first to fourth circuit areas G1_CA, B1_CA, G2_CA, and R1_CA are disposed. That is, a reflective layer 209 is further provided below the first electrode 210 of the organic light emitting diode disposed in the fourth emission area B1 which emits light with the second color. Therefore, the emission efficiency of the organic light emitting diode disposed in the fourth emission area B1 may be improved.

Figure 8:
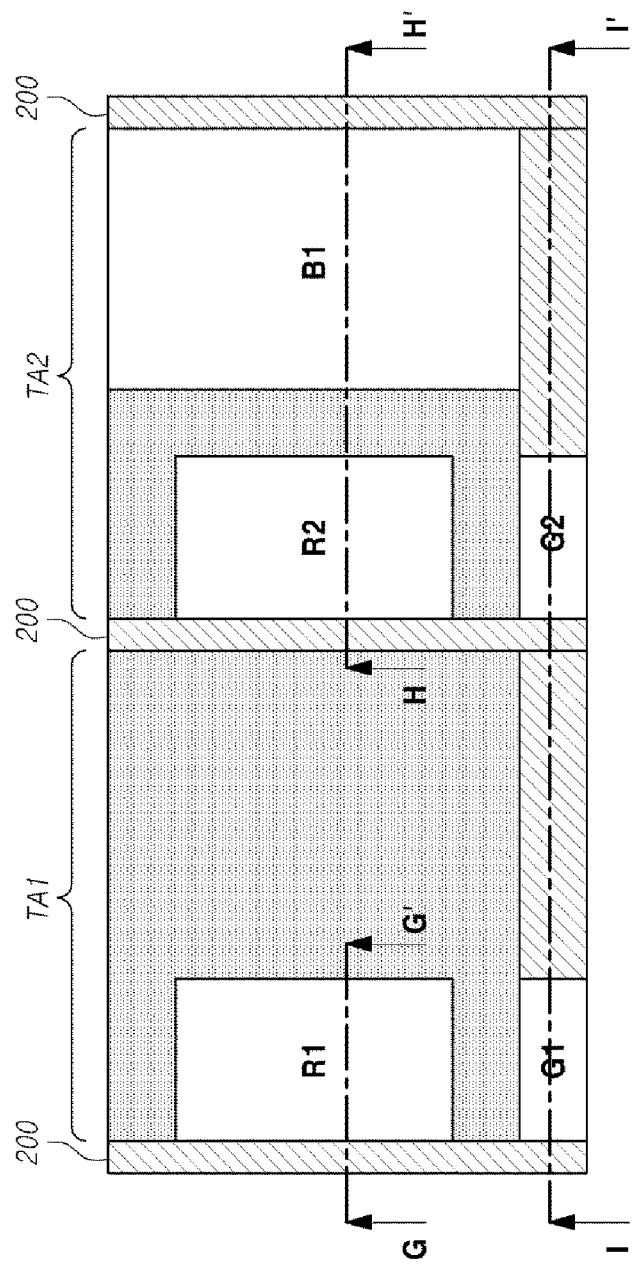
FIG. 8 is a plan view of a transparent display device according to a third exemplary embodiment of the present invention.
Figure 9:
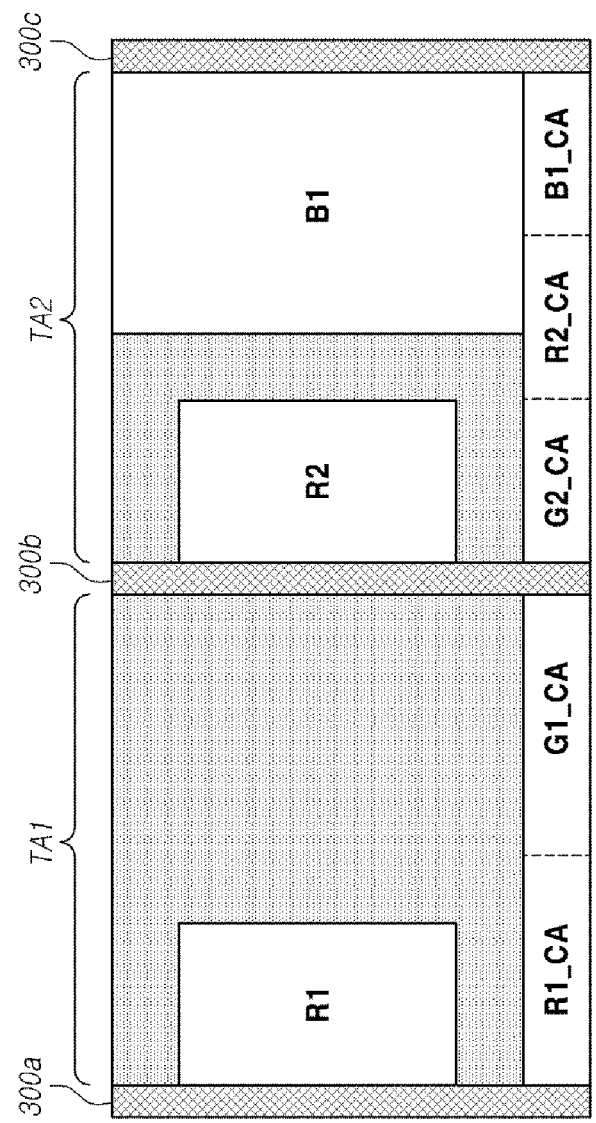
FIG. 9 is a schematic plan view of a circuit area of a transparent display device according to a third exemplary embodiment of the present invention.
Figure 10A:
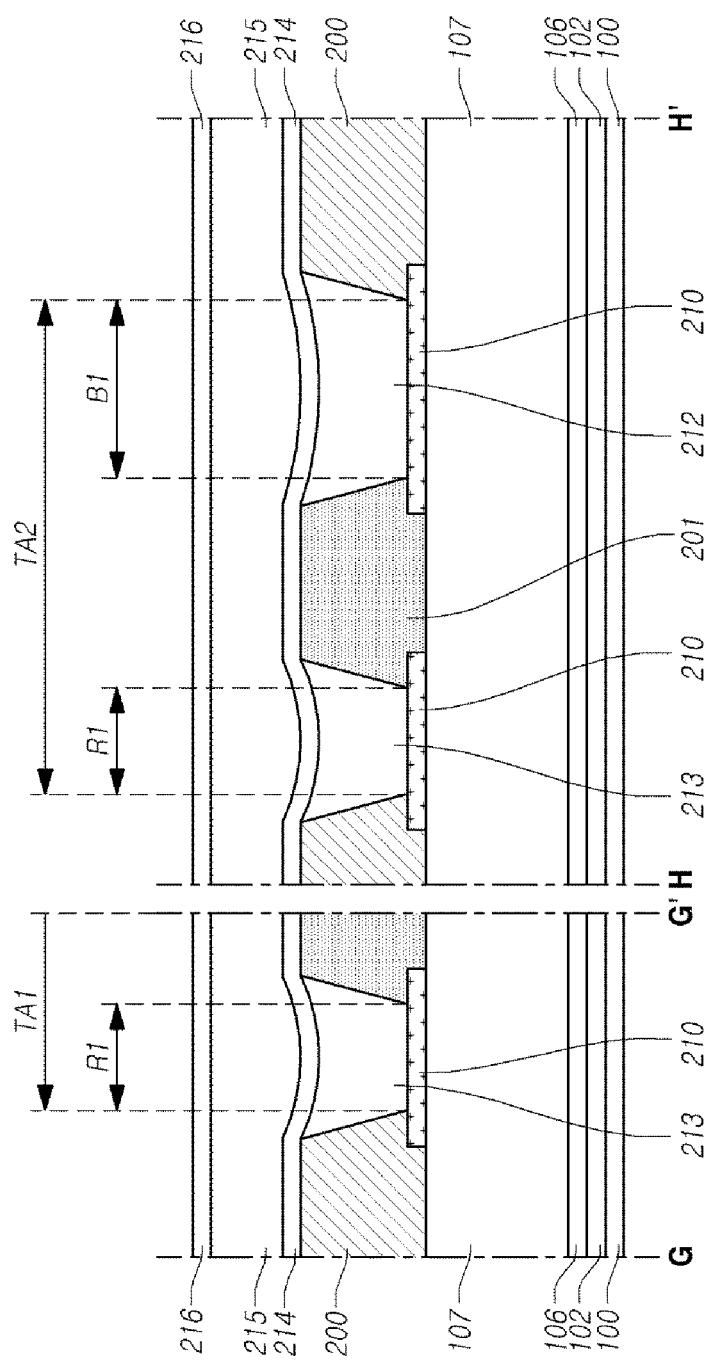
FIG. 10A is a cross-sectional view of a transparent display device according to a third exemplary embodiment of the present invention taken along the lines G-G' and H-H'.
Figure 10B:
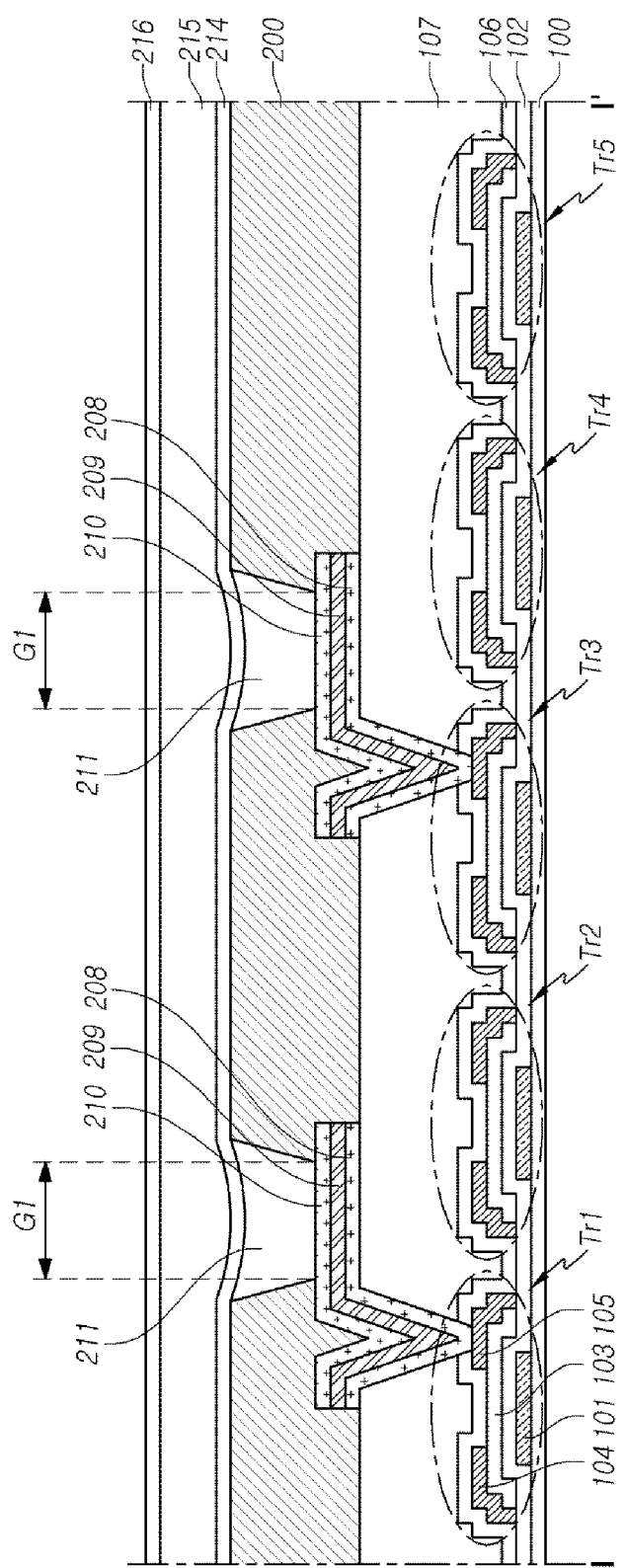
FIG. 10B is a cross-sectional view of a transparent display device according to a third exemplary embodiment of the present invention taken along the line I-I'.

Next, a transparent display device according to a third exemplary embodiment of the present invention will be described with reference to FIGS. 8 to 10B, as follows. FIG. 8 is a plan view of a transparent display device according to a third exemplary embodiment of the present invention. FIG. 9 is a schematic plan view of a circuit area of a transparent display device according to a third exemplary embodiment of the present invention. FIG. 10A is a cross-sectional view of a transparent display device according to a third exemplary embodiment of the present invention taken along the lines G-G' and H-H'. FIG. 10B is a cross-sectional view of a transparent display device according to a third exemplary embodiment of the present invention taken along the line I-I'.

The transparent display device according to the third exemplary embodiment may include the same components as those of the above-described exemplary embodiments. Redundant descriptions thereof will be omitted. Further, like reference numerals generally refer to like components.

Referring to FIGS. 8, 9, 10A, and 10B, in the transparent display device according to the third exemplary embodiment of the present invention, two pixel regions are configured by five sub pixel regions. Through this structure, a same resolution as that of the RGB structure may be achieved while using a reduced overall number of sub pixels. Each of the five sub pixel regions may include one emission area and one circuit area. Further, the two pixel regions may include a first transmission area TA1 and a second transmission area TA2.

Further, each of the two pixel regions may include a plurality of circuit areas. Specifically, the two pixel regions may include a first circuit area R1_CA, a second circuit area G1_CA, a third circuit area G2_CA, a fourth circuit area R2_CA, and a fifth circuit area B1_CA as illustrated in FIG. 9.

Here, the arrangement relationship of the first to fifth circuit areas R1_CA, G1_CA, G2_CA, R2_CA, and B1_CA are not limited to those illustrated in FIG. 9. The first to fifth circuit areas R1_CA, G1_CA, G2_CA, R2_CA, and B1_CA may be disposed in various configurations and forms to drive the plurality of emission areas.

Further, although not illustrated in the drawings, the first circuit area R1_CA may be connected to a data line included in a first column line 300a and the second circuit area G1_CA may be connected to a data line included in a second column line 300b. Further, the third circuit area G2_CA may also be connected to a data line included in the second column line 300b and the fifth circuit area B1_CA may be connected to a data line which is included in a third column line 300c. The fourth circuit area R2_CA may be connected to a data line included in another column line that overlaps the second column line 300b or the third column line 300c.

The first column line 300a and the second column line 300b may include any one of a high potential voltage line and a low potential voltage line. For example, the high potential voltage line and the low potential voltage line may be connected to the first circuit area R1_CA, the second circuit area G1_CA, the third circuit area G2_CA, and the fifth circuit area B1_CA. Further, the fourth circuit area R2_CA may be connected to a high potential voltage line and a low potential voltage line included in the other column lines.

In the meantime, in the transparent display device according to the third exemplary embodiment of the present invention, the first emission area R1 and the second emission area R2 may emit light with the third color, and the third emission area B1 may emit light with the second color. Further, the fourth emission area G1 and the fifth emission area G2 may emit light with the first color.

Further, as illustrated in FIGS. 8 and 10A, the first emission area R1 shares a part of a region where the first transmission area TA1 is disposed and the second emission area R2 and the third emission area B1 share a part of a region where the second transmission area TA2 is disposed.

Further, as illustrated in FIGS. 8 and 10B, the fourth emission area G1 and the fifth emission area G2 share a part of a region where the circuit areas R1_CA, G1_CA, G2_CA, R2_CA, and B1_CA are disposed. In this case, a reflective layer 209 and a transparent conductive layer 208 may be provided below a first electrode 210 of an organic light emitting diode which is disposed in the fourth emission area G1 and the fifth emission area G2 which emit light with the first color.

That is, in the transparent display device according to the third exemplary embodiment of the present invention, a part of the region where the transmission areas TA1 and TA2 are disposed may be shared by the first to third emission areas R1, R2, and B2. Therefore, the transmission area may be expanded without being affected by the emission areas. Further, in the transparent display device according to the third exemplary embodiment of the present invention, a part of the region where the circuit areas R1_CA, G1_CA, G2_CA, R2_CA, and B1_CA are disposed may be shared with the fourth and fifth emission areas G1 and G2. Therefore, the emission efficiency of organic light emitting diodes disposed in the fourth emission area and the fifth emission area G1 and G2 may be improved.

Figure 11:
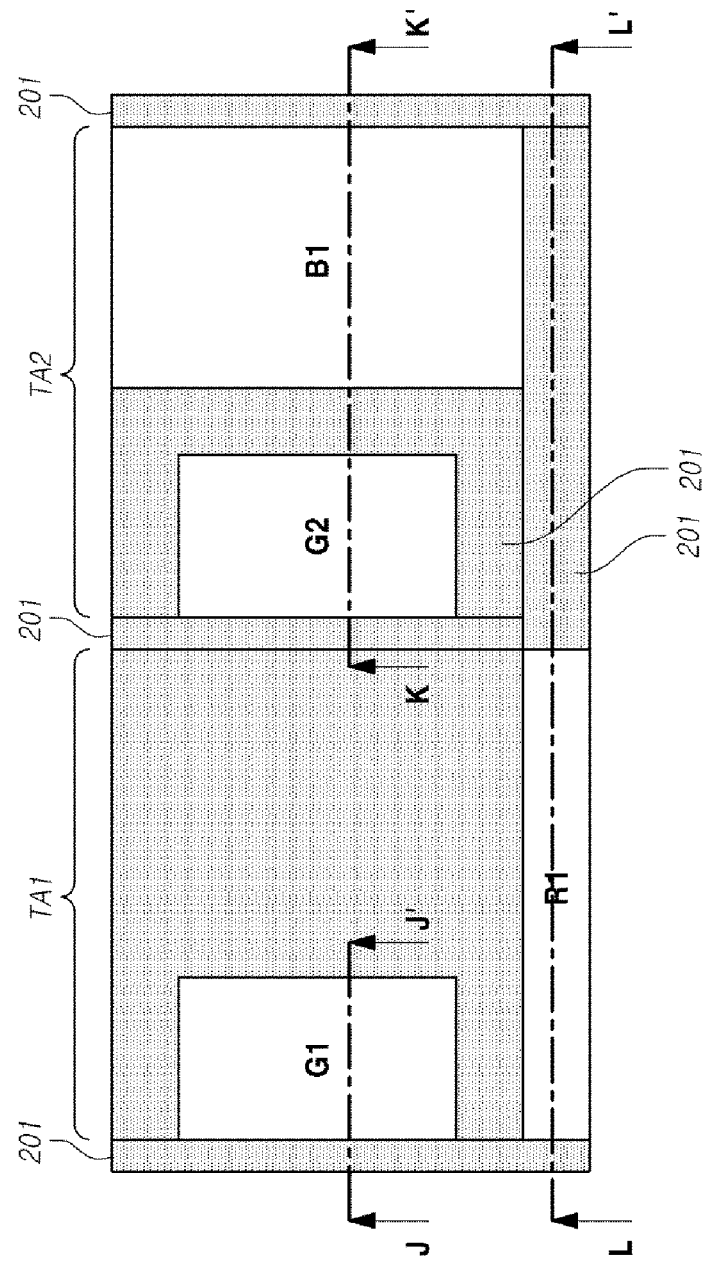
FIG. 11 is a plan view of a transparent display device according to a fourth exemplary embodiment of the present invention.
Figure 12A:
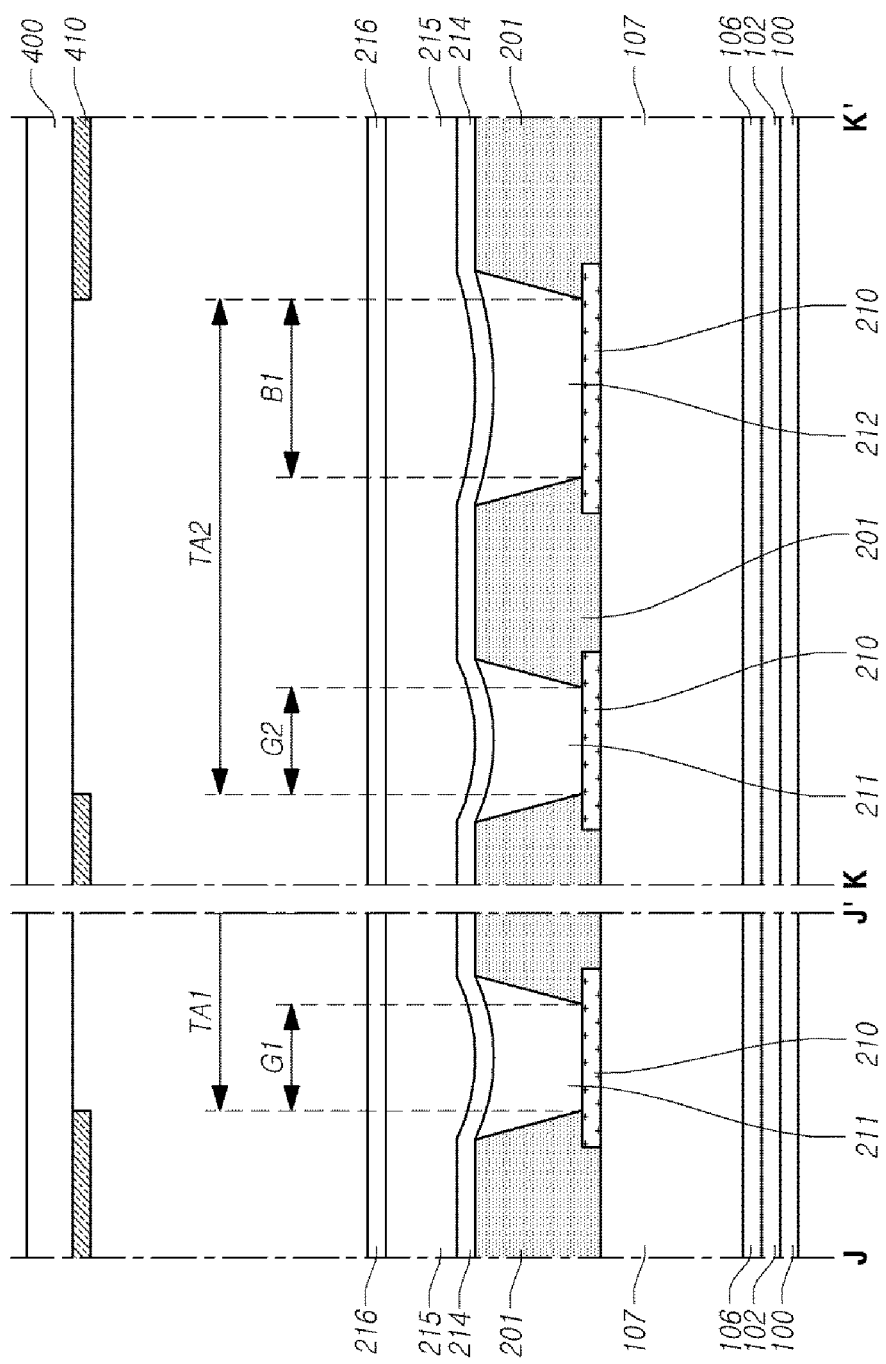
FIG. 12A is a cross-sectional view of a transparent display device according to a fourth exemplary embodiment of the present invention taken along the lines J-J' and K-K'.
Figure 12B:
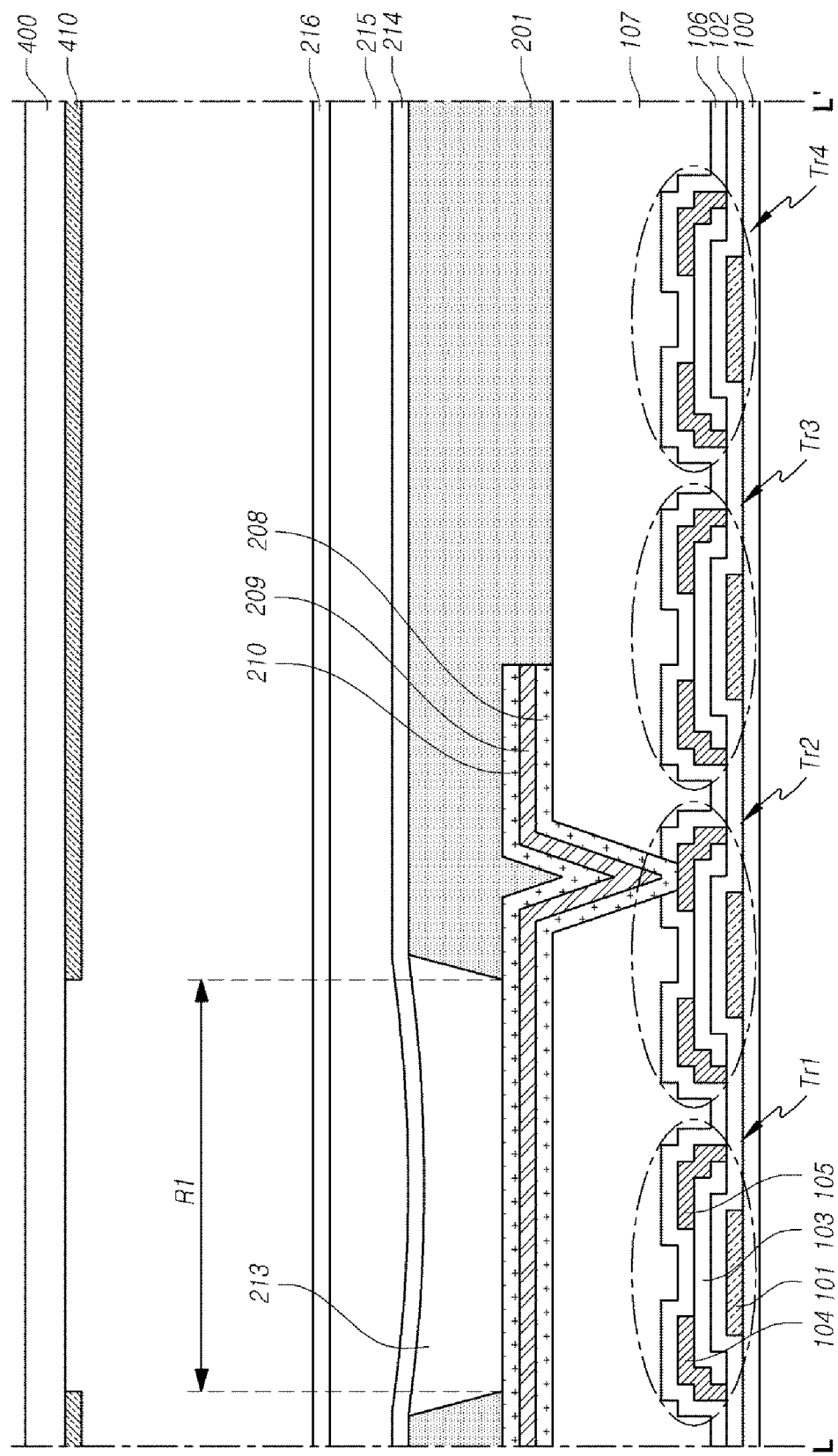
FIG. 12B is a cross-sectional view of a transparent display device according to a fourth exemplary embodiment of the present invention taken along the line L-L'.

Next, a transparent display device according to a fourth exemplary embodiment of the present invention will be described with reference to FIGS. 11 to 12B, as follows. FIG. 11 is a plan view of a transparent display device according to a fourth exemplary embodiment of the present invention. FIG. 12A is a cross-sectional view of a transparent display device according to a fourth exemplary embodiment of the present invention taken along the lines J-J' and K-K'. FIG. 12B is a cross-sectional view of a transparent display device according to a fourth exemplary embodiment of the present invention taken along the line L-L'.

The transparent display device according to the fourth exemplary embodiment may include the same components as those of the above-described exemplary embodiments. Redundant descriptions thereof will be omitted. Further, like reference numerals generally refer to like components.

Referring to FIGS. 11, 12A, and 12B, a second bank pattern 201 according to the fourth exemplary embodiment of the present invention may be disposed. In particular, second bank patterns 201 disposed on transmission areas TA1 and TA2 and a second bank pattern 201 which overlap column lines and a region where circuit areas are disposed may be formed by the same process. Therefore, the process may be simplified.

Further, although not illustrated in the drawings, the circuit areas of the transparent display device according to the fourth exemplary embodiment of the present invention may be disposed and configured in similar fashion as those of the first exemplary embodiment.

In FIGS. 12A and 12B, a second substrate 400 is disposed to be opposite to the first substrate 100 on which a thin film transistor and an organic light emitting diode are disposed. A plurality of black matrixes 410 are disposed to be spaced apart from each other on one surface of the second substrate 400. In this case, the black matrixes 410 may be disposed in a region corresponding to a region where the column lines and the circuit areas are disposed. Through such a configuration, light leakage due to the organic light emitting diodes may be suppressed.

As described above, in the transparent display device according to the exemplary embodiments of the present invention, elements disposed in the emission areas are disposed in a transmission area or an opaque area (circuit area) in consideration of the characteristics of the elements. Therefore, the emission efficiency may be appropriately adjusted. Specifically, an organic light emitting diode which has a low emission efficiency may be disposed in the opaque area (circuit area), so that the efficiency thereof may be increased. Further, a part of the emission area of the transparent display device may share a part of the region where the transmission area is disposed, so that the transmission area may be increased regardless of an emission size of the emission area.

Features, structures, and effects described in the above-described exemplary embodiments are included in at least one exemplary embodiment of the present invention, but are not limited to only one exemplary embodiment. Further, features, structures, and effects exemplified in each exemplary embodiment may be embodied by being combined with another exemplary embodiment or modified by those skilled in the art. It should be interpreted that the combined and modified contents are included in the scope of the present invention.

In the above description, the present invention has been described based on the exemplary embodiments, but the exemplary embodiments are for illustrative, and do not limit the present invention, and those skilled in the art will appreciate that various modifications and applications, which are not exemplified in the above description, may be made without departing from the scope of the essential characteristic of the present exemplary embodiments. For example, each component described in detail in the embodiments can be modified.

What is claimed is:

1. A transparent display panel, comprising:
   a plurality of data lines;
   a plurality of gate lines; and
   a plurality of pixel regions disposed in a matrix,
   wherein the plurality of pixel regions are arranged so that two pixel regions are configured by at least four sub pixel regions, the two pixel regions including at least four sub pixel regions are next to each other,
   wherein the two pixel regions together include a first transmission area, a second transmission area, and a circuit area, and
   wherein the first transmission area includes a first emission area, the second transmission area includes second and third emission areas, and the two pixel regions together further include at least one fourth emission area which partially or entirely overlaps with the circuit area.

2. The transparent display panel according to claim 1, wherein a column line which includes two data lines of the plurality of data lines and at least one voltage line is disposed at each pixel region.

3. The transparent display panel according to claim 2, wherein the column line overlaps with a first bank pattern.

4. The transparent display panel according to claim 3, wherein the first bank pattern is formed of an opaque organic material.

5. The transparent display panel according to claim 1, wherein each of the first, second and third emission areas disposed in the first and second transmission areas includes an organic light emitting diode,
wherein the organic light emitting diode includes first and second electrodes formed of a transparent conductive material, and an organic light emitting layer formed of a transparent organic material.

6. The transparent display panel according to claim 1, wherein a second bank pattern is disposed in a region excluding the first, second and third emission areas in the first transmission area and the second transmission area.

7. The transparent display panel according to claim 6, wherein the second bank pattern is formed of a transparent organic material.

8. The transparent display panel according to claim 1,
wherein the at least one fourth emission area disposed in the circuit area includes an organic light emitting diode,
wherein the organic light emitting diode includes a first electrode, an organic light emitting layer, and a second electrode which are formed of transparent materials, and
wherein the organic light emitting diode further includes a reflective layer disposed below the first electrode.

9. The transparent display panel according to claim 1, wherein, if the at least one fourth emission area only partially overlaps with the circuit area, a region of the circuit area which does not overlap with the emission area overlaps with a first bank pattern.

10. The transparent display panel according to claim 1, wherein at least one of the plurality of pixel regions includes a plurality of emission areas which emit light with a first color, a second color, and a third color, and
wherein emission sizes of the emission areas for individual colors are equal to each other.

11. The transparent display panel according to claim 1, wherein at least one of the plurality of pixel regions includes a plurality of emission areas which emit light with a first color, a second color, and a third color, and
wherein emission sizes of the emission areas for the first, second and third colors are different from each other.

12. The transparent display panel according to claim 1, wherein two pixel regions are configured by five sub pixel regions.

13. The transparent display panel according to claim 12, wherein in the two pixel regions, a first transmission area includes one emission area and a second transmission area includes two emission areas, and the two emission areas overlap with the circuit areas.

14. The transparent display panel according to claim 1, wherein a region of the circuit areas excluding the region which overlaps with the emission areas is disposed to overlap with a second bank pattern and
wherein a column line is disposed to overlap with a second bank pattern.

15. The transparent display panel according to claim 14, further comprising:
a second substrate including a black matrix disposed in a region corresponding to the second bank pattern and excluding the transmission areas.

16. A transparent display device, comprising:
a data driver which drives a plurality of data lines;
a gate driver which drives a plurality of gate lines; and
the transparent display panel according to claim 1.

17. The transparent display panel according to claim 1, wherein the first, second and third emission areas included in the first or second transmission areas emit a light having a different color from a light emitted by a fourth emission area included in the circuit area adjacent to the first or second transmission areas.

\* \* \* \* \*